United States Patent
Fujiwara et al.

(10) Patent No.: US 7,456,449 B2
(45) Date of Patent: *Nov. 25, 2008

(54) SEMICONDUCTOR APPARATUS, LED PRINT HEAD, AND PRINTER

(75) Inventors: Hiroyuki Fujiwara, Hachioji (JP);
Takahito Suzuki, Hachioji (JP);
Susumu Chihara, Hachioji (JP);
Mitsuhiko Ogihara, Hachioji (JP);
Ichimatsu Abiko, Tokyo (JP); Masaaki Sakuta, Tokyo (JP)

(73) Assignee: Oki Data Corporation, Tokyo (JP)

( * ) Notice: Subject to any disclaimer, the term of this patent is extended or adjusted under 35 U.S.C. 154(b) by 244 days.

This patent is subject to a terminal disclaimer.

(21) Appl. No.: 10/998,801

(22) Filed: Nov. 30, 2004

(65) Prior Publication Data
US 2005/0127389 A1    Jun. 16, 2005

(30) Foreign Application Priority Data
Dec. 4, 2003  (JP)  ............................. 2003-405682

(51) Int. Cl.
*H01L 27/76* (2006.01)
(52) U.S. Cl. ........................ 257/231; 257/232; 257/233; 257/234; 257/48; 257/88; 257/72; 257/E33.055
(58) Field of Classification Search .................... 257/72, 257/88, 231–234, 349, 48, E33.055
See application file for complete search history.

(56) References Cited

U.S. PATENT DOCUMENTS

| | | | | |
|---|---|---|---|---|
| 4,924,276 A | * | 5/1990 | Heime et al. ................... | 257/99 |
| 5,406,095 A | * | 4/1995 | Koyama et al. ................ | 257/88 |
| 6,023,308 A | * | 2/2000 | Takemura ..................... | 349/42 |
| 6,054,723 A | * | 4/2000 | Tajiri et al. ..................... | 257/88 |
| 6,078,061 A | * | 6/2000 | Koya ............................ | 257/91 |
| 6,191,438 B1 | * | 2/2001 | Ikehara et al. ................. | 257/99 |
| 6,236,065 B1 | * | 5/2001 | Kurahashi et al. ............. | 257/93 |
| 6,617,644 B1 | * | 9/2003 | Yamazaki et al. ........... | 257/347 |
| 6,919,931 B2 | * | 7/2005 | Chae ............................ | 349/40 |
| 6,936,407 B2 | * | 8/2005 | Pichler ........................ | 430/311 |
| 6,955,951 B2 | * | 10/2005 | Hashimoto ................... | 438/149 |
| 7,042,052 B2 | * | 5/2006 | Bhattacharyya ............. | 257/347 |
| 7,061,113 B2 | * | 6/2006 | Fujiwara et al. ............. | 257/758 |

FOREIGN PATENT DOCUMENTS

JP    10-150221    6/1998

* cited by examiner

*Primary Examiner*—Eugene Lee
(74) *Attorney, Agent, or Firm*—Rabin & Berdo, PC

(57) ABSTRACT

A semiconductor apparatus has a substrate to which is attached a thin semiconductor film including at least one semiconductor device. An interconnecting line links the semiconductor film with electrical circuitry on the substrate. The interconnecting line includes a pad located on the substrate, between the thin semiconductor film and the electrical circuitry. The pad, which is wider than other parts of the interconnecting line, can be used as a probe pad for testing the apparatus, and in particular for testing the electrical circuitry on the substrate before the thin semiconductor film is attached.

15 Claims, 6 Drawing Sheets

SEMICONDUCTOR APPARATUS, LED PRINT HEAD, AND PRINTER

BACKGROUND OF THE INVENTION

1. Field of the Invention

The present invention relates to a semiconductor apparatus having a thin semiconductor film attached to a substrate, and more particularly to the provision of probe pads in the apparatus. The invention also relates to a printing head and printer using the invented semiconductor apparatus.

2. Description of the Related Art

An example of a printer in which the present invention can be practiced to advantage is an electrophotographic printer employing light-emitting diodes as light sources. A conventional electrophotographic printer of this type has a light-emitting diode (LED) print head comprising a linear array of LEDs paralleled by driving circuits that supply current to the LEDs. The LEDs are formed in one or more compound semiconductor chips comprising, for example, gallium arsenide (GaAs); the driving circuits are integrated into one or more silicon (Si) semiconductor chips. The LED array chips and the driver integrated circuit (IC) chips are interconnected by wire bonding, and have pads for the attachment of bonding wires.

The wire bonding pads are in general larger than the LEDs. If a separate wire bonding pad is provided for each LED, the layout of the wire bonding pads presents a problem to which various solutions have been adopted. One solution, for example, employs a staggered arrangement of wire bonding pads and offsets the wiring that leads from the wire bonding pads to the LEDs, as described in Japanese Unexamined Patent Application Publication No. 10-150221.

Regardless of how the wire bonding pads are laid out, they take up considerable space on each LED array chip. From the standpoint of effective use of expensive compound semiconductor materials, this is highly uneconomical, and it prevents the cost of the LED array chips from being reduced beyond a certain point. The wire bonding pads on the driver chips are similarly uneconomical.

Furthermore, although an LED array chip is typically about three hundred micrometers (300 µm) thick, the LEDs occupy only about the uppermost five micrometers (5 µm) of the chip thickness, the rest of the thickness being necessary merely for mechanical support. This also is highly uneconomical.

An attractive solution to this problem is to form the LEDs in a thin compound semiconductor film, which is then attached to the silicon substrate of the driver chips, and to connect the LEDs to their driving circuits through conductive lines formed on the chip surface, instead of by wire bonding. Considerable compound semiconductor material can thus be saved, since none has to be used for mechanical support, or to provide space for wire bonding pads. Testing of the LEDs, the driving circuits, and their interconnections presents a problem, however.

In particular, if the only way to test the driving circuits is to measure the light output from the LEDs, a defective driving circuit in the silicon substrate will remain undiscovered until the thin compound semiconductor film has been attached; then when the defect is found, both the silicon substrate and the attached compound semiconductor film will have to be discarded, even though there may be no defects in the compound semiconductor film. It would be desirable if silicon substrates with defective circuits could be screened out before any compound semiconductor films were attached.

More generally, it would be desirable to improve the testability of any semiconductor apparatus of the type having a thin semiconductor film attached to a substrate, so that defects could be found as early as possible in the fabrication process, to avoid wasting further time and materials on defective devices.

SUMMARY OF THE INVENTION

An object of the present invention is to improve the testability of a semiconductor apparatus having a thin semiconductor film attached to the substrate.

The invented semiconductor apparatus has a substrate including electrical circuitry, and a thin semiconductor film attached to the substrate. The thin semiconductor film is formed separately from the substrate, and includes at least one semiconductor device.

An interconnecting line, disposed on surfaces of the thin semiconductor film and the substrate, interconnects the semiconductor device with the electrical circuitry. The interconnecting line includes a pad disposed on the substrate between the thin semiconductor film and the electrical circuitry. The pad is wider than other parts of the interconnecting line.

The pad can be probed during the fabrication of the semiconductor apparatus to test the electrical circuitry before the attachment of the thin semiconductor film, for example, or to test the semiconductor device after the attachment of the thin semiconductor film.

The invention also provides an optical print head such as an LED print head including the invented semiconductor apparatus. The thin semiconductor film in the semiconductor apparatus may include a plurality of light-emitting semiconductor devices. The optical print head may also include a base for supporting the semiconductor apparatus, a rod lens array for focusing light emitted by light-emitting semiconductor devices in the semiconductor apparatus, a holder for holding the rod lens array, and at least one clamp for holding the base and the holder together.

The invention further provides a printer comprising at least one optical print head including the invented semiconductor apparatus. The printer may also include a photosensitive image carrier electrically charged by a charging unit and selectively illuminated by the optical print head to form a latent electrostatic image, a developing unit for supplying a recording agent to develop the latent electrostatic image on the photosensitive image carrier, and a transfer unit for transferring the developed image from the photosensitive image carrier to printing media.

DETAILED DESCRIPTION OF THE INVENTION

Figure 1:
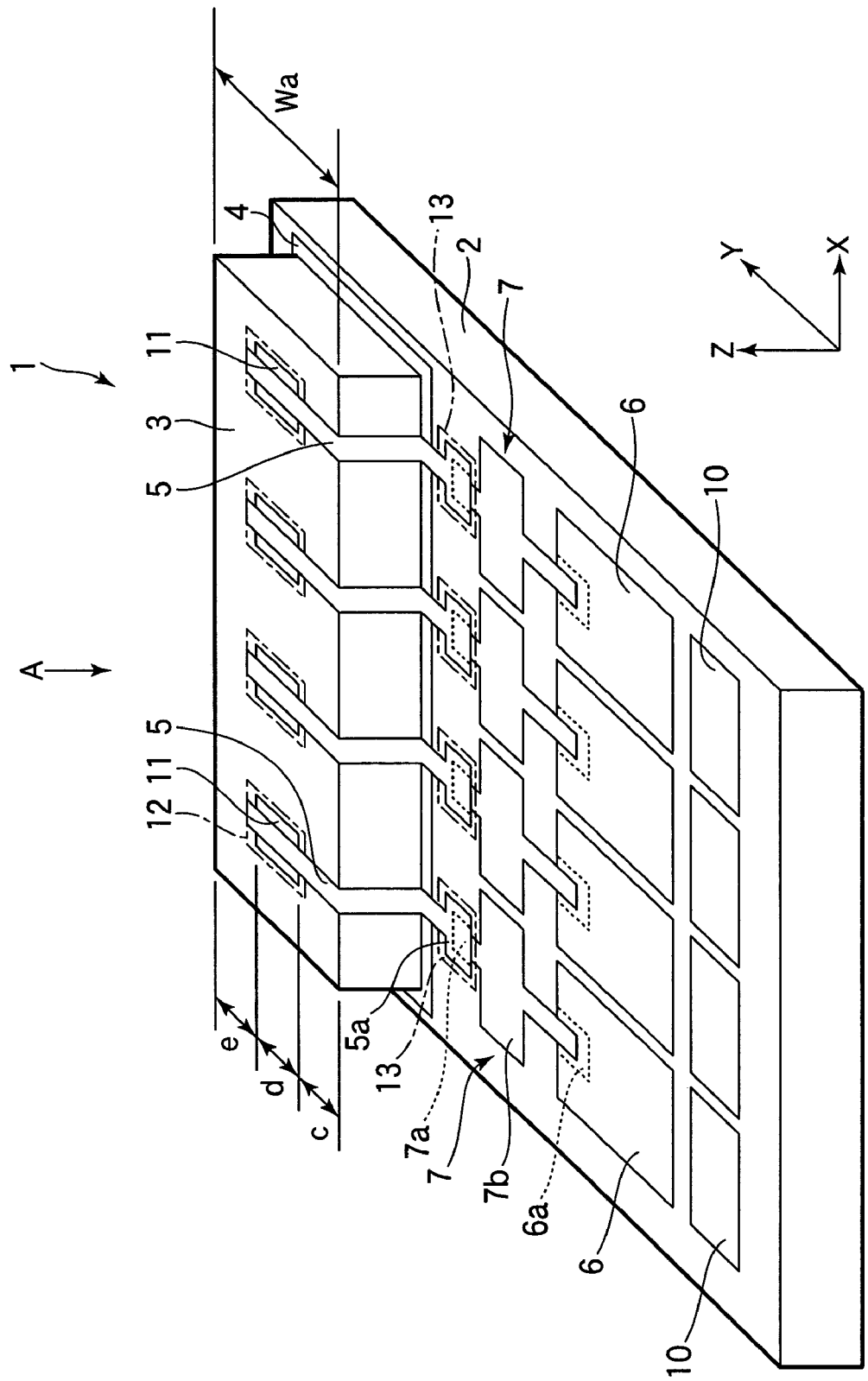
FIG. 1 is a perspective view schematically showing a combined LED/driver IC chip according to a first embodiment of the invention.

Embodiments of the invention will now be described with reference to the attached drawings, in which like elements are indicated by like reference characters.

First Embodiment

Referring to FIG. 1, a combined LED/driver IC chip 1 according to a first embodiment of the invention comprises a silicon substrate 2 to which a thin compound semiconductor film, referred to below as an LED epitaxial film or LED epi-film 3, is attached. More precisely, the LED epi-film 3 is attached to a metal layer 4 formed on part of one major surface of the silicon substrate 2. The LED epi-film 3 has a plurality of light-emitting devices 11 (LEDs) formed at regular intervals in a linear array.

Electrical circuitry, more specifically LED driving circuitry for driving the LEDs 11, is integrated into the silicon substrate 2. The electrical circuitry includes a plurality of output areas 6 facing respective LEDs 11, each output area 6 including an output transistor (not visible) and its on-off switching circuit (likewise not visible). The LED driving circuitry includes an output terminal 6a in each output area 6. The output terminals 6a are connected to respective LEDs 11 by interconnecting lines, each interconnecting line comprising a first electrode 5 and a second electrode 7.

The second electrodes 7 are formed on the silicon substrate 2, extending from respective output areas 6 toward the LED epi-film 3. Each second electrode 7 has a first end making electrical contact with the output terminal 6a in its output area 6, a widened second end 7a disposed comparatively near the LED epi-film 3, and a probe pad 7b disposed between the first and second ends. The probe pad 7b is wider than other parts of the second electrode 7, including the widened second end 7a.

Figure 2:
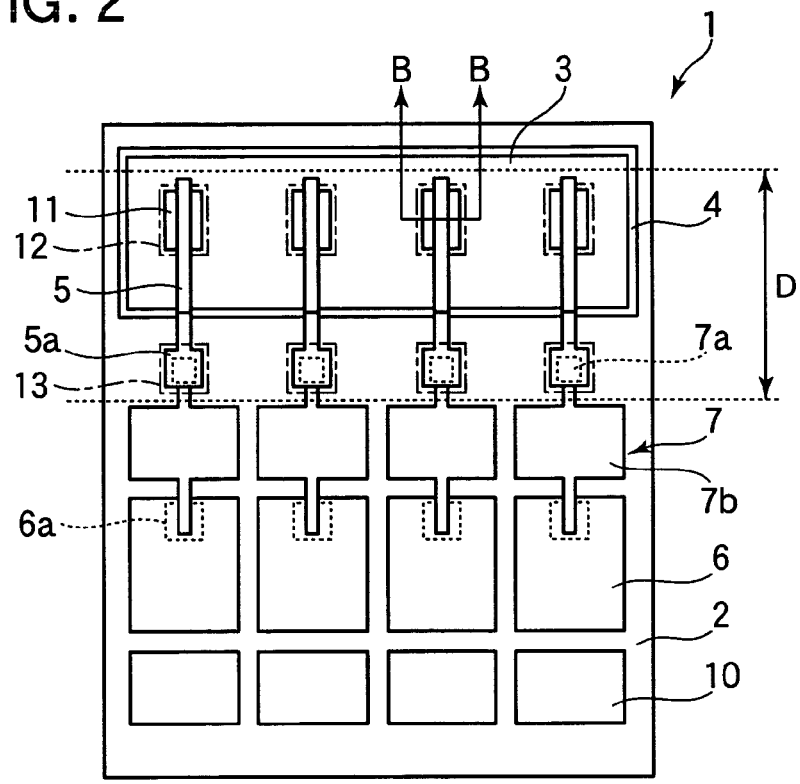
FIG. 2 is a top view showing the combined LED/driver IC chip as seen from the direction of arrow A in FIG. 1.

In the region of width D indicated by the dashed lines in FIG. 2, the second electrodes 7, the surface and sides of the LED epi-film 3, and the exposed parts of the metal layer 4 are covered by an interlayer dielectric film. A further dielectric film (not shown in the drawings) preferably insulates the second electrodes 7 from the surface of the silicon substrate 2, except where they make electrical contact with the output terminals 6a of the output areas 6.

The first electrodes 5 are formed on the above-mentioned interlayer dielectric film, partly on the top surface and one side surface of the LED epi-film 3 and partly on the silicon substrate 2. Each first electrode 5 has a first end making electrical contact with one of the LEDs 11 in the LED epi-film 3 through a contact hole 12 in the interlayer dielectric film, and a widened second end 5a making electrical contract with a corresponding one of the second electrodes 7 through another contact hole 13 in the interlayer dielectric film. The widened second end 5a of the first electrode 5 is wider than the widened second end 7a of the second electrode 7.

A plurality of input/output pads 10, through which power, data signals, clock signals, and other necessary signals are supplied to the driving circuitry, are formed on the silicon substrate 2 near the output areas 6.

In the XYZ coordinate system shown in FIG. 1, the X axis is parallel to the direction in which the LEDs 11 are arrayed. The Y axis is parallel to the surface of the silicon substrate 2 and orthogonal to the X axis. The Z axis is orthogonal to both the X and Y axes.

The width Wa of the LED epi-film 3 in the Y-axis direction is slightly greater than the dimensions of the LEDs 11 in this direction. In FIG. 1, for example, if the width (d) of the LEDs 11 in the Y-axis direction is 15 µm, then to leave gaps (c, e) of 10 µm between the LEDs 11 and the edges of the LED epi-film 3, the width (Wa) of the LED epi-film 3 should be 35 µm. This is much less than the conventional width of an LED array chip, which is typically about 400 µm.

The LED epi-film 3 is preferably formed from a purely epitaxial layer, as will be explained later. The LED epi-film 3 only has to be thick enough to give the LEDs 11 stable optical and electrical characteristics, and can be made as thin as, for example, 2 µm. This is much thinner than the conventional 300-µm thickness of an LED array chip.

The metal layer 4 is formed on the surface of the silicon substrate 2 in an area adjacent to the output areas 6 of the LED driving circuitry but not overlapping the LED driving circuitry. The functions of the metal layer 4 include both attachment of the LED epi-film 3 in a predetermined position near the integrated circuit area in the silicon substrate 2, and electrical contact with the LED epi-film 3 and the silicon substrate 2, the metal layer 4 thus serving as a common return electrode of the LEDs 11 in the LED epi-film 3. An electrical contact between the undersurface of the LED epi-film 3 and the surface of the silicon substrate 2 is necessary to enable the LED driving circuitry integrated into the silicon substrate 2 to drive the LEDs 11. Ohmic contacts are preferably formed between the metal layer 4 and the surfaces of the silicon substrate 2 and LED epi-film 3.

The LEDs 11 and the LED driving integrated circuits are thus electrically interconnected in two ways. Each LED 11 is connected through a first electrode 5 and second electrode 7 to the output area 6 of a driving circuit integrated into the silicon substrate 2, and all of the LEDs 11 are connected through the metal layer 4 to a common terminal area of the silicon substrate 2, which is connected to the driving circuitry, forming a circuit through which current can flow.

The second electrodes 7 are formed before the LED epi-film 3 is attached to the silicon substrate 2. After the LED epi-film 3 has been attached to the silicon substrate 2, the above-mentioned interlayer dielectric film and the first electrodes 5 are formed, the first electrodes 5 making electrical contact (preferably, ohmic contact) with the second electrodes 7 through the contact holes 13 in the dielectric film. The first electrodes 5 are formed by, for example, depositing a thin metal film and patterning the film by photolithography. The second electrodes 7 may be formed in the same way.

The thin metal films from which the first and second electrodes 5, 7 are formed may be films containing gold (Au), such as a single-layer gold film, a multi-layer film with titanium, platinum, and gold layers (a Ti/Pt/Au film), a multi-layer film with gold and zinc layers (an Au/Zn film), or a multi-layer film with a gold layer and a gold-germanium-nickel layer (an AuGeNi/Au film). Alternatively, films containing palladium (Pd) may be used, such as a single-layer palladium film or a multi-layer film with palladium and gold layers (a Pd/Au film). Films containing aluminum (Al) may also be used, e.g., a single-layer aluminum film or a multi-layer film with aluminum and nickel layers (an Al/Ni film). The thickness of these films may be, for example, in the range from 0.5 µm to 2.5 µm, thinner films being preferable from the standpoint of conserving metal materials.

The necessary size of the probe pads 7b depends on the equipment that will be used to test the chip 1 during the fabrication process. The test equipment typically includes a probe card with needles that are pressed against the probe pads 7b. To assure good electrical contact, the needles are pressed several micrometers past the point of contact with the probe pads 7b, causing their tips to slide in the Y-axis direction. The Y-axis dimension of the probe pads 7b needs to be large enough to accommodate this slide, and to allow a margin for error in the alignment and positioning of the needle tips. The minimum dimension that meets these requirements is preferred, to minimize the size and therefore the cost of the chip 1. The X-axis dimension also needs to be large enough to allow for needle tip alignment and positioning error, but this dimension does not affect the chip size, so the maximum dimension consistent with electrical separation of adjacent probe pads 7b may be used, as shown in FIGS. 1 and 2.

Figure 3:
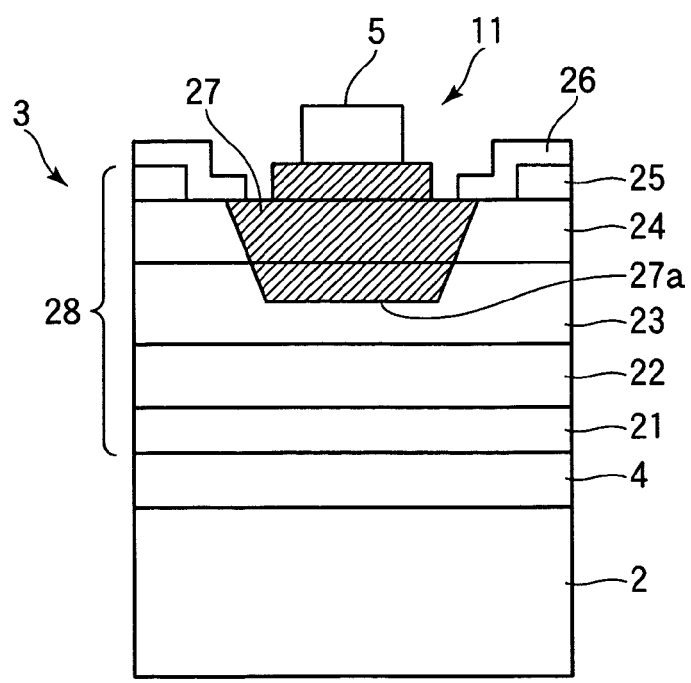
FIG. 3 is a schematic sectional view of an LED as seen through line B-B in FIG. 2.

The LEDs 11 will now be described with reference to the sectional view in FIG. 3, which shows the silicon substrate 2, the metal layer 4, and the various layers of an LED 11. These layers include the first electrode 5 and the interlayer dielectric film 26 mentioned above, and several semiconductor epitaxial layers 28. The semiconductor epitaxial layers 28 are n-type semiconductor layers, except in a zinc diffusion area 27, as will be described later.

The semiconductor epitaxial layers 28 comprise, from the bottom up, an n-type GaAs layer 21 and three n-type aluminum gallium arsenide (AlGaAs) layers: an $Al_xGa_{1-x}As$ lower cladding layer 22 ($0 \leq x \leq 1$), an $Al_yGa_{1-y}As$ active layer 23 ($0 \leq y \leq 1$), and an $Al_yGa_{1-y}As$ upper cladding layer 24 ($0 \leq z \leq 1$). A second n-type GaAs contact layer 25 is formed on the n-type $Al_zGa_{1-z}As$ layer 24 and then partially removed around the edges of the zinc diffusion area 27.

The semiconductor epitaxial layers 28 of the LED epi-film 3 may be formed by well-known techniques such as metal organic chemical vapor deposition (MOCVD) or molecular beam epitaxy (MBE). The n-type GaAs layer 21 may be ten nanometers (10 nm) thick, the $Al_xGa_{1-x}As$ lower cladding layer 22 may be one-half micrometer (0.5 μm) thick, the $Al_yGa_{1-y}As$ active layer 23 may be 1.0 μm thick, the $Al_zGa_{1-z}As$ upper cladding layer 24 may be 0.5 μm thick, and the second n-type GaAs contact layer 25 may be 10 nm thick. The total thickness of the semiconductor epitaxial layers 28 is then 2.02 μm. The aluminum composition ratios x, y, z of the AlGaAs layers are preferably selected so that x>y and z>y (e.g., x=z=0.4, y=0.1), and the diffusion front 27a of the zinc diffusion region 27 is preferably located within the n-type $Al_yGa_{1-y}As$ active layer active 23.

The zinc diffusion area 27 is a p-type area, so a pn junction is formed at the boundary between it and the n-type parts of the semiconductor epitaxial layers 28. With this structure, minority carriers injected through the pn junction are confined within the n-type $Al_yGa_{1-y}As$ active layer 23 and the p-type $Al_yGa_{1-y}As$ region created therein by zinc diffusion, so that high luminous efficiency is obtained. The structure shown in FIG. 3 enables high luminous efficiency to be obtained with an LED epi-film 3 as thin as about 2 μm.

The LED epi-film 3 is grown on, for example, a gallium arsenide (GaAs) substrate (not shown) having a separation layer of aluminum arsenide (AlAs). After the semiconductor epitaxial layers 28 and zinc diffusion area 27 have been formed, the GaAs substrate is etched to create trenches dividing the epitaxial layers into LED epi-films 3 of the desired size, and the AlAs separation layer is etched to release the LED epi-films 3, which are then transferred to one or more silicon substrates 2 and bonded to the metal films 4 formed thereon.

Next, the function of the probe pads 7b will be described.

Figure 4:
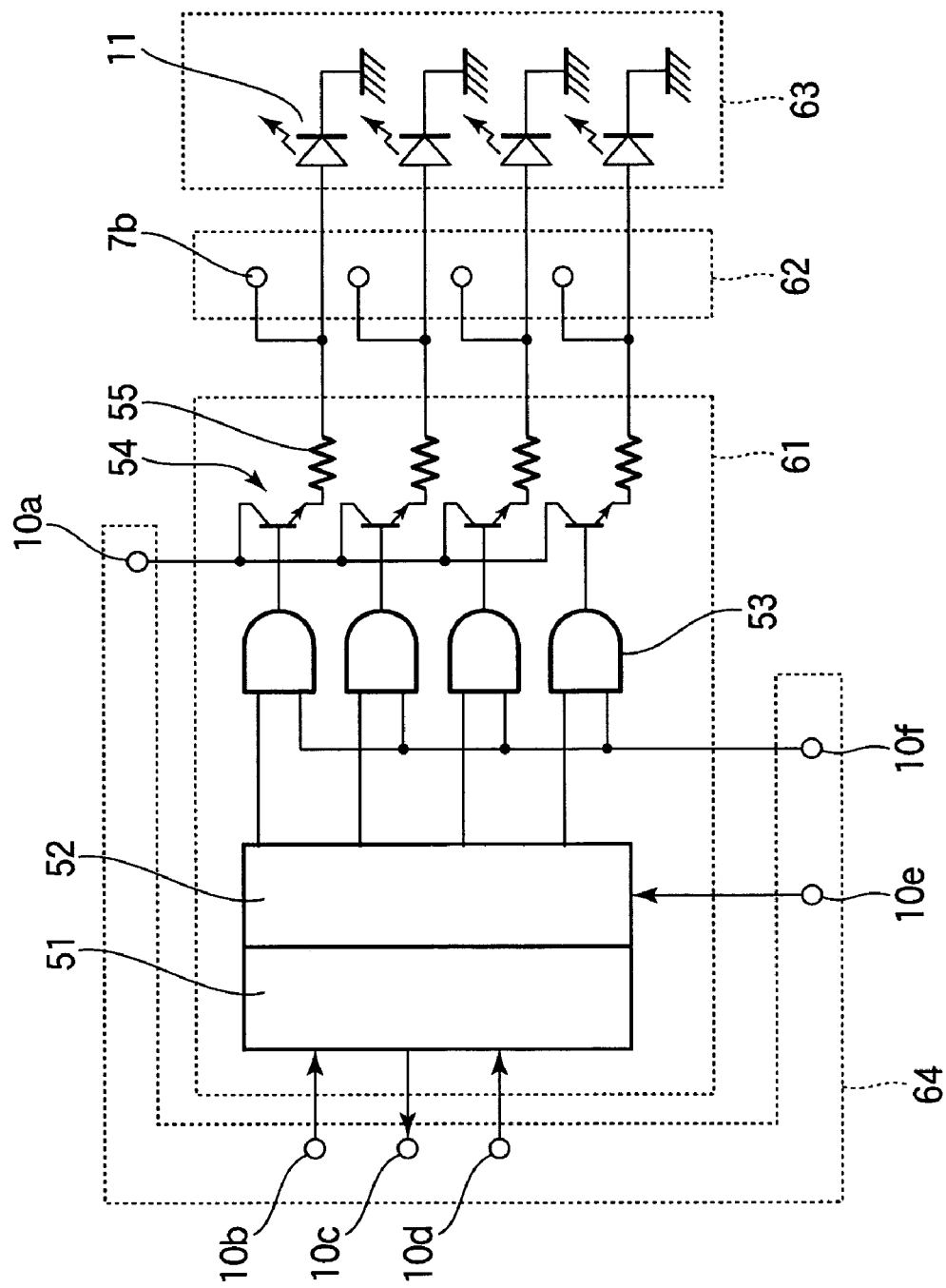
FIG. 4 is a schematic circuit diagram of the combined LED/driver IC chip in FIG. 1.

Referring to FIG. 4, the driving circuitry integrated into the silicon substrate 2 includes a shift register 51, a latch circuit 52, an array of AND gates 53, an array of transistors 54, and an array of resistors 55. These circuit elements constitute a driver block 61. The other parts of the combined LED/driver IC chip 1 can be divided into a probe block 61 including the probe pads 7b, an LED array block 63 including the LEDs 11, and an input/output block 64 including the input/output pads 10. The input/output pads 10 include a power supply (Vdd) input pad 10a, a data signal input pad 10b, a data signal output pad 10c, a clock signal input pad 10d, a load signal input pad 10e, and a strobe signal input pad 10f. For convenience, the probe pads 7b are shown as branches from the interconnecting lines that connect the driving circuitry 61 to the LED array 63; this arrangement is electrically equivalent to the arrangement shown in FIGS. 1 and 2, in which the probe pads 7b are centered on the interconnecting lines.

Before the LED epi-film 3 is attached to the silicon substrate 2, to test the driving circuitry block 61, probe needles are brought into electrical contact with the probe pads 7b in the probe block 62. Data, clock, and load signals are supplied to input/output pads 10b, 10d, 10e to load data into the latch circuit 52; then a strobe signal is supplied to output the latched data through the AND gates 53 to the driving transistors 54, allowing the data to turn on the transistors 54, and the flow of current from the power pad 10a through the transistors 54 and resistors 55 to the probe pads 7b is measured.

If this test indicates that the driving circuit block 61 is operating normally, the LED epi-film 3 is attached, the interlayer dielectric film is deposited, contact holes are opened, and the first electrodes 5 are formed. To test the first electrodes 5 and LEDs 11, the probe needles are brought into electrical contact again, the strobe signal is held at the low (ground) level, and driving current is supplied directly to the probe pads 7b. Due to a reverse emitter-base voltage, substantially none of this current is conducted through the transistors 54; almost all of the current flows to the LEDs 11. The resulting light output can then be measured to test the operation of the LEDs 11 and the first electrodes 5.

The ability to test the driving circuit block 61 and the LED array block 63 separately is useful not only in preventing good LED epi-films from being wastefully attached to a defective substrate, but also in analyzing the cause of defects that may found in the combined LED/driver IC chip 1, since it enables the defects to be isolated to the driving circuitry or the LEDs. Appropriate corrective measures can then be taken, by changing fabrication process parameters, for example, so that the process does not continue producing defective chips.

For simplicity, the drawings show a single LED epi-film 3 with only four LEDs 11 attached to the silicon substrate 2, but in general n LED epi-films having m LEDs each may be attached to the same silicon substrate, creating a linear array of m×n LEDs, where m and n are arbitrary positive integers. A matrix driving scheme may also be used.

In a variation of the first embodiment, the semiconductor epitaxial layers 28 of the LED epi-film 3 are attached to a non-conductive substrate such as a glass plate, instead of a silicon substrate 2, and the LED driving circuits are formed on the glass plate from polycrystalline silicon by a low-temperature growth process.

In another variation, the metal layer 4 is omitted, and the LED epi-film is bonded directly to the silicon or glass substrate. The common return electrode of the LEDs 11 may be formed on the upper surface of the LED epi-film 3, and may be connected to the driving circuitry by a separate interconnecting line.

In yet another variation, the second ends 5a of the first electrodes 5 are disposed on the LED epi-film 3, and further interconnecting lines are formed to connect the second ends 5a of the first electrodes 5 to the second ends 7a of the second electrodes 7.

These variations also apply to the embodiments that follow.

Second Embodiment

The second embodiment has the same overall structure as the first embodiment, shown in FIGS. 1 and 2, but differs in the structure of the LED epi-film 3 and LEDs.

Figure 5:
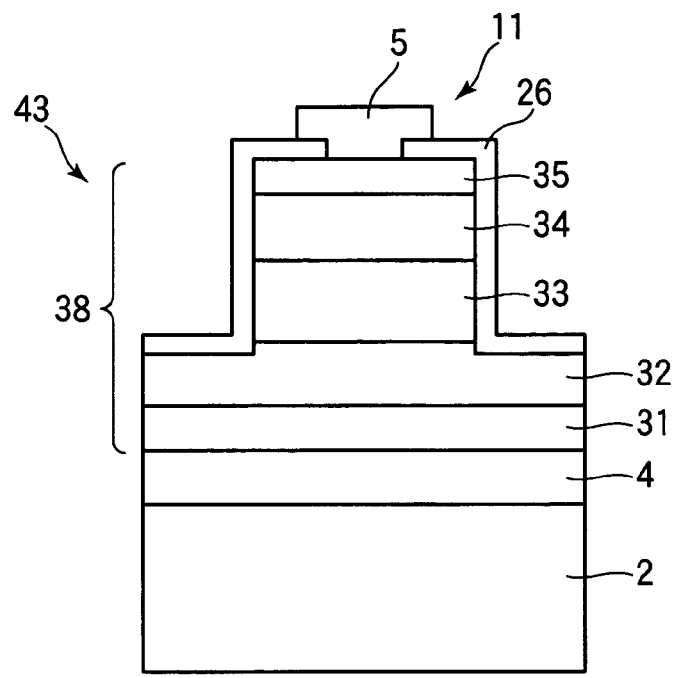
FIG. 5 is a schematic sectional view of an LED in a second embodiment of the invention.

FIG. 5 shows a cross-sectional view of the combined LED/driver IC chip in the second embodiment. The silicon substrate 2, metal layer 4, first electrode 5, and interlayer dielectric film 26 are the same as in the first embodiment. The semiconductor epitaxial layers 38 in the LED epi-film 43 include an n-type GaAs layer 31, an n-type $Al_xGa_{1-x}As$ lower cladding layer 32 ($0 \leq x \leq 1$), a p-type $Al_yGa_{1-y}As$ active layer 33 ($0 \leq y \leq 1$), a p-type $Al_zGa_{1-z}As$ upper cladding layer 34 ($0 \leq z \leq 1$), and a p-type GaAs contact layer 35.

The n-type GaAs layer 31 may be 10 nm thick, the n-type $Al_xGa_{1-x}As$ lower cladding layer 22 may be 0.5 μm thick, the p-type $Al_yGa_{1-y}As$ active layer 33 may be 0.2 μm thick, the p-type $Al_zGa_{1-z}As$ upper cladding layer 34 may be 0.5 μm thick, and the p-type GaAs contact layer 35 may be 10 nm thick. The total thickness of the semiconductor epitaxial layers 38 is then only 1.22 μm.

The above LED structure is a double hetero-structure. It is also possible to employ a homojunction structure and various other structures, drawings of which will be omitted.

Third Embodiment

Figure 6:
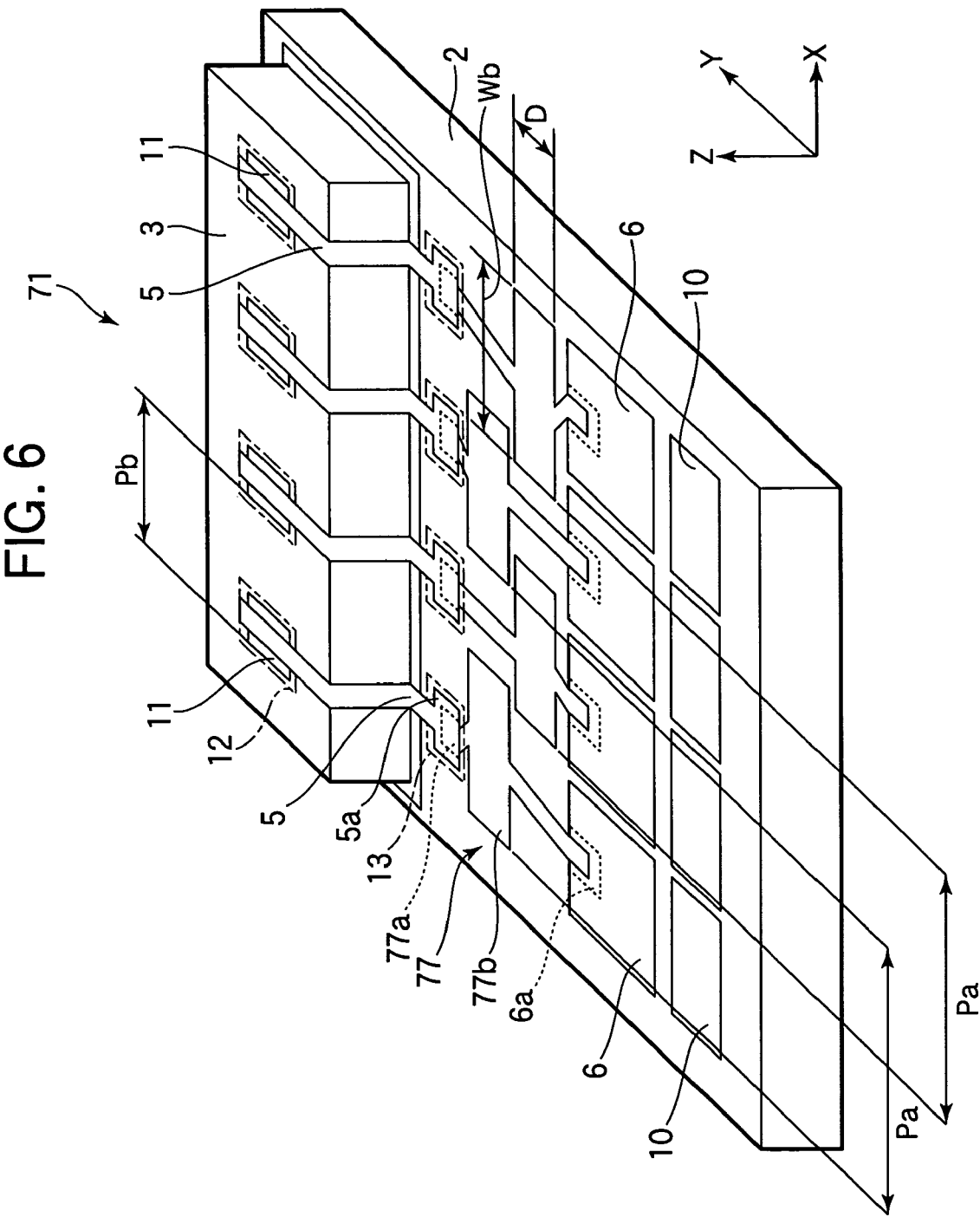
FIG. 6 is a perspective view schematically showing a combined LED/driver IC chip according to a third embodiment of the invention.

Referring to FIG. 6, the combined LED/driver IC chip 71 in the third embodiment employs second electrodes 77 with a staggered arrangement of probe pads 77b. In other respects, the third embodiment is similar to the first embodiment.

As in the first embodiment, the first end of each second electrode 77 makes electrical contact with the output terminal 6a in an output area 6 of the driving circuitry integrated into the silicon substrate 2, and the second end 77a of the second electrode 77 makes electrical contact with the second end 5a of the corresponding first electrode 5. The probe pads 77b are disposed alternately in two rows, both parallel to the row of output areas 6. The pitch Pa of the probe pads 77b in each row is therefore twice the pitch Pb of the LEDs 11. The width Wb of the probe pads 77b in the X-axis direction can also be greater than in the first embodiment. The dimension D of the probe pads 77b in the Y-axis direction may be the same as in the first embodiment, e.g. the minimum dimension that allows an adequate margin for error in probe needle alignment and positioning and an adequate margin for sliding of the needle tips.

The centers of the probe pads 77b may be offset from the centers of the LEDs 11, to enable maximum use to be made of the space in each row. To accommodate the offset, the second electrodes 77 may be disposed at various angles to the Y-axis, as shown in the drawing.

Compared with the first embodiment, the third embodiment has the disadvantage of increasing the size of the combined LED/driver IC chip 71 in the Y-axis direction, but the advantage of allowing the combined LED/driver IC chip 71 to be tested easily even if the spacing between adjacent LEDs 11 is less than the minimum spacing between adjacent probe needles in the test equipment. If necessary, the probe pads 77b can be arranged in three or more rows to accommodate the minimum probe needle spacing.

Fourth Embodiment

Figure 7:
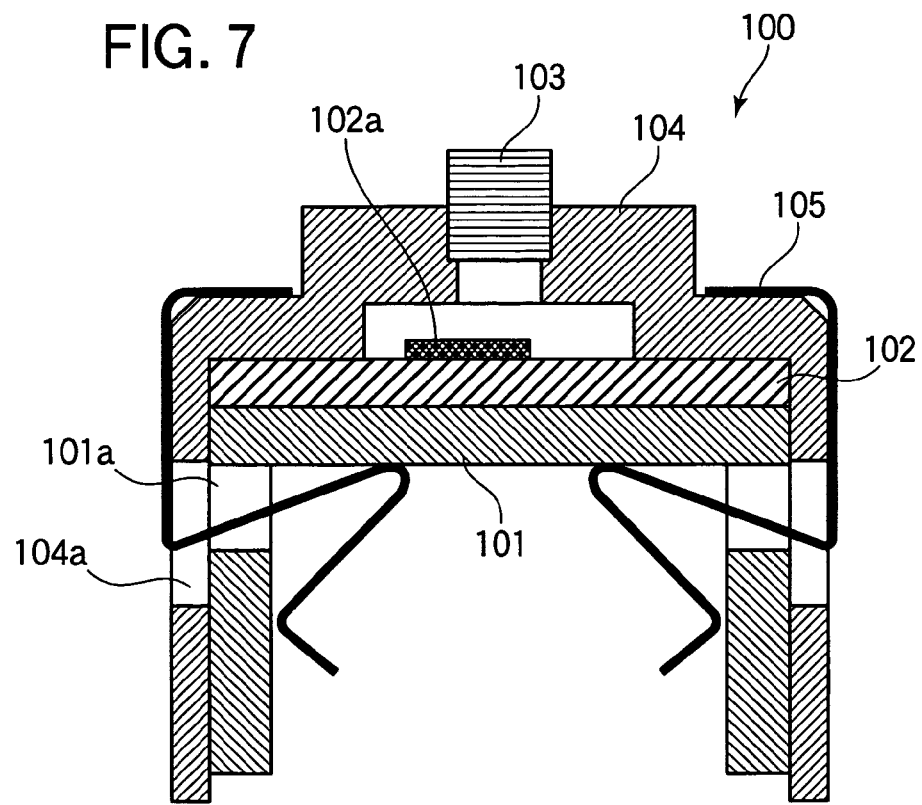
FIG. 7 is a sectional view schematically showing an LED print head according to a fourth embodiment of the invention.

The present invention can also be embodied in an LED print head. Referring to FIG. 7, the LED print head 100 includes a base 101 on which an LED unit 102 is mounted. The LED unit 102 includes one or more combined LED/driver IC chips 1 or 71 of the type described in any of the first three embodiments, mounted so that their light-emitting parts 102a (the LED epi-films) are positioned beneath a rod lens array 103. The rod lens array 103 is supported by a holder 104. The base 101, LED unit 102, and holder 104 are held together by dampers 105 that extend through openings 101a, 104a in the base 101 and holder 104.

Light emitted by the light-emitting diodes in the LED unit 102 is focused by rod lenses in the rod lens array 103 onto, for example, a photosensitive image carrier such as a photosensitive drum (not shown) in an electrophotographic printer or copier.

Use of the combined LED/driver IC chips shown in the first to the third embodiments saves space and leads to a substantial reduction in compound semiconductor material requirements, as compared with conventional LED print heads employing separate driver ICs and LED array chips, while still enabling the driving circuits and LEDs to be tested separately. Benefits include the maintenance of high product quality at a reduced manufacturing cost.

Fifth Embodiment

Figure 8:
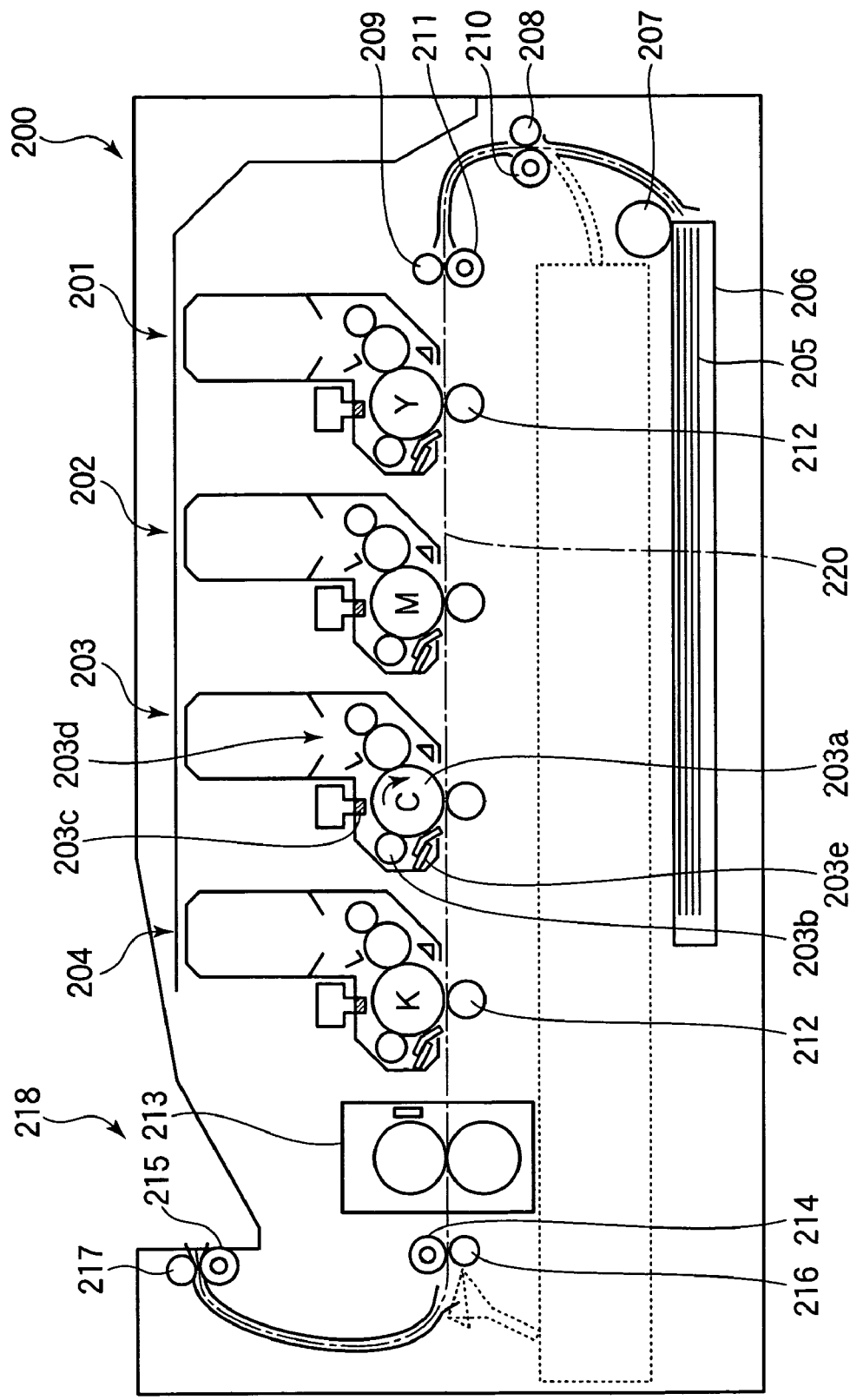
FIG. 8 is a sectional view schematically showing a full-color printer according to a fifth embodiment of the invention.

Referring to FIG. 8, a fifth embodiment of the invention is a full-color printer 200 comprising a yellow (Y) process unit 201, a magenta (M) process unit 202, a cyan (C) process unit 203, and a black (K) process unit 204, which are mounted following one another in tandem fashion. The cyan process unit 203, for example, includes a photosensitive drum 203a that turns in the direction indicated by the arrow, a charging unit 203b that supplies current to the photosensitive drum 203a to charge the surface thereof, an LED print head 203c that selectively illuminates the charged surface of the photosensitive drum 203a to form an electrostatic latent image, a developing unit 203d that supplies cyan toner particles to the surface of the photosensitive drum 203a to develop the electrostatic latent image, and a cleaning unit 203e that removes remaining toner from the photosensitive drum 203a. The print head 203c has, for example, the structure shown in FIG. 7, including one or more combined LED/driver IC chips of the type described in any of the first three embodiments. The other process units 201, 202, 204 are similar in structure to the cyan process unit 203, but use different toner colors.

Paper 205 (or other media) is held as a stack of sheets in a cassette 206. A hopping roller 207 feeds the paper 205 one sheet at a time toward a paired transport roller 210 and pinch roller 208. After passing between these rollers, the paper 205 travels to a registration roller 211 and pinch roller 209, which feed the paper toward the yellow process unit 201.

The paper 205 passes through the process units 201, 202, 203, 204 in turn, traveling in each process unit between the photosensitive drum and a transfer roller 212 made of, for example, semi-conductive rubber. The transfer roller 212 is charged so as to create a potential difference between it and the photosensitive drum. The potential difference attracts the toner image from the photosensitive drum onto the paper 205. A full-color image is built up on the paper 205 in four stages, the yellow process unit 201 printing a yellow image, the magenta process unit 202 a magenta image, the cyan process unit 203 a cyan image, and the black process unit 204 a black image.

From the black process unit 204, the paper 205 travels through a fuser 213, in which a heat roller and back-up roller apply heat and pressure to fuse the transferred toner image onto the paper. A first delivery roller 214 and pinch roller 216 then feed the paper 205 upward to a second delivery roller 215 and pinch roller 217, which deliver the printed paper onto a stacker 218 at the top of the printer.

The photosensitive drums and various of the rollers are driven by motors and gears not shown in the drawing.

The LED print heads account for a significant part of the manufacturing cost of this type of LED printer 200. By using easily testable and space-efficient combined LED/driver IC chips and enabling these chips to be manufactured with reduced material costs, the present invention enables a high-quality printer to be produced at a comparatively low cost. In particular, use of the LED print head described in the fourth embodiment makes it possible to obtain high quality and space efficiency at a reduced cost.

The fifth embodiment is not limited to the type of full-color tandem printer shown in FIG. 8. The invention may also be practiced in a monochrome printer or a multi-color printer or copier.

The above embodiments have been described by using an LED epi-film as an exemplary thin semiconductor film, but various other types of thin semiconductor films can be employed instead, such as a thin semiconductor film including photodetector devices, logic devices, piezoelectric devices, or other applicable semiconductor devices instead of light-emitting devices.

Those skilled in the art will recognize that further variations are possible within the scope of the invention, which is defined in the appended claims.

What is claimed is:

1. A semiconductor apparatus, comprising:
    a semiconductor substrate including electrical circuitry that is contained within the semiconductor substrate;
    a thin semiconductor film disposed on the semiconductor substrate, the thin semiconductor film being formed separately from the semiconductor substrate and attached to the semiconductor substrate, the thin semiconductor film including at least one semiconductor device; and
    an interconnecting line disposed on respective surfaces of the thin semiconductor film and the semiconductor substrate, interconnecting the semiconductor device with the electrical circuitry, the interconnecting line including a probe pad disposed on the semiconductor substrate between the thin semiconductor film and the electrical circuitry, the probe pad being wider than parts of the interconnecting line other than the probe pad, the probe pad being used for testing whether the electrical circuitry operates normally.

2. The semiconductor apparatus of claim 1, wherein the interconnecting line comprises:
    a first electrode having a first end and a second end, the first end making electrical contact with the semiconductor device in the thin semiconductor film, the second end being disposed on the semiconductor substrate; and
    a second electrode having a first end and a second end, the first end making electrical contact with the electrical circuitry, the second end making electrical contact with the second end of the first electrode, the probe pad being disposed between the first end of the second electrode and the second end of the second electrode.

3. The semiconductor apparatus of claim 2, wherein the second electrode is formed before the thin semiconductor film is attached to the semiconductor substrate, enabling the electrical circuitry to be tested by probing the probe pad before the thin semiconductor film is attached.

4. The semiconductor apparatus of claim 2, wherein the probe pad includes (1) a portion that protrudes toward a first direction perpendicular to a second direction in which the interconnecting line interconnects the semiconductor device with the electrical circuitry and (2) another portion that protrudes toward an opposite direction to the first direction, so that the probe pad and portions of the interconnecting line adjacent to the probe pad collectively form a cross-shaped region.

5. The semiconductor apparatus of claim 2, further comprising an interlayer dielectric film that is configured to define a contact hole therein,
    wherein the second electrode is covered by the interlayer dielectric film, the first electrode is formed on the interlayer dielectric film, and the second end of the second electrode makes electrical contact with the second end of the first electrode through the contact hole of the interlayer dielectric film.

6. The semiconductor apparatus of claim 2, wherein the probe pad includes (1) a portion that protrudes toward a first direction perpendicular to a second direction in which the interconnecting line interconnects the semiconductor device with the electrical circuitry and (2) another portion that protrudes toward an opposite direction to the first direction, so that the probe pad and portions of the interconnecting line adjacent to the probe pad collectively form a cross-shaped region.

7. The semiconductor apparatus of claim 2, further comprising an interlayer dielectric film that is configured to define a contact hole therein,
    wherein the second electrode is covered by the interlayer dielectric film, the first electrode is formed on the interlayer dielectric film, and the second end of the second electrode makes electrical contact with the second end of the first electrode through the contact hole of the interlayer dielectric film.

8. The semiconductor apparatus of claim 7, wherein the probe pads are disposed in a plurality of rows parallel to the linear array of the light-emitting devices.

9. The semiconductor apparatus of claim 8, wherein the pads are disposed in a staggered arrangement.

10. The semiconductor apparatus of claim 1, wherein the thin semiconductor film is a compound semiconductor film.

11. The semiconductor apparatus of claim 10, wherein the semiconductor substrate is a silicon substrate.

12. An optical print head including the semiconductor apparatus of claim 1.

13. The optical print head of claim 12, wherein the semiconductor device in the thin semiconductor film in the semiconductor apparatus is light-emitting device, the semiconducor apparatus including a plurality of such light-emitting devices, the optical print head further including:
    a base for supporting the semiconductor apparatus;
    a rod lens array for focusing the light emitted by the light-emitting devices in the semiconductor apparatus;
    a holder for holding the rod lens array; and
    at least one clamp for holding the base and the holder together.

14. A printer comprising at least one optical print head including the semiconductor apparatus of claim 1.

15. The printer of claim 14, further comprising:

a photosensitive image carrier selectively illuminated by the optical print head to form a latent electrostatic image;

a charging unit for electrically charging the photosensitive image carrier before illumination by the optical print head;

a developing unit for supplying a recording agent to develop the latent electrostatic image on the photosensitive image carrier; and transfer unit for transferring the developed image from the photosensitive image carrier to printing media.

* * * * *